Jan. 3, 1956 H. C. GOODRICH 2,729,708

BAND-PASS AMPLIFIER SYSTEMS

Filed Feb. 2, 1951

INVENTOR
Hunter C. Goodrich
BY
ATTORNEY

United States Patent Office 2,729,708

Patented Jan. 3, 1956

2,729,708

BAND-PASS AMPLIFIER SYSTEMS

Hunter C. Goodrich, Collingswood, N. J., assignor to Radio Corporation of America, a corporation of Delaware Application February 2, 1951, Serial No. 209,163

3 Claims. (Cl. 179—171)

Figure 1:
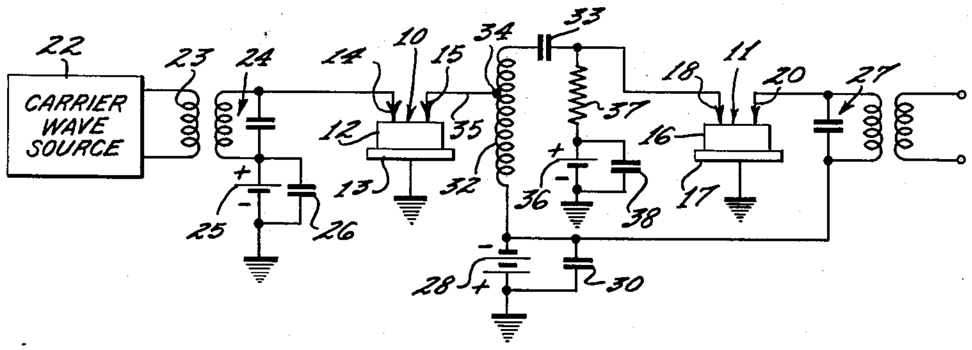

This invention relates generally to amplifier systems, and particularly relates to cascaded semi-conductor amplifier circuits for a modulated carrier wave providing a predetermined pass band.

A semi-conductor amplifier such as a transistor amplifier includes a semi-conducting device having a semi-conducting body which may, for example, consist of a germanium crystal. A base electrode is in low-resistance contact with the crystal and an emitter and a collector electrode are in rectifying contact with the crystal. When this device is used as an amplifier, the input signal is usually impressed on the emitter and the amplified output signal is derived from the collector so that the base electrode is the common electrode for the input and output circuits.

Difficulties have been experienced in the past in matching the output impedance of one transistor amplifier to the input impedance of the succeeding transistor amplifier. This is due to the fact that the output impedance of such a transistor amplifier is of the order of 10,000 ohms while its input impedance may amount to 500 ohms or less. Accordingly, it is conventional practice to provide a coupling transformer between successive stages for the purpose of matching the input impedance of one stage to the output impedance of the next stage. Such transformers, however, are expensive.

Furthermore, a transistor amplifier may be considered essentially as a current operated device. Accordingly, in order to increase the gain of a cascaded amplifier system, it would be desirable to provide for a current gain in the coupling circuit between amplifier stages. In some cases, it is also desirable to provide an amplifier system having a single-ended or unbalanced input circuit and a push-pull or balanced output circuit.

It is accordingly an object of the present invention to provide a cascaded transistor amplifier system wherein impedance matching between successive amplifier stages is provided without requiring transformer coupling.

A further object of the invention is to provide cascade connected transistor amplifier stages having a predetermined pass band and a current gain which are both determined by the Q of a resonant coupling circuit.

Another object of the invention is to provide a transistor amplifier system of the type referred to which has a single-ended input circuit and a balanced or push-pull output circuit.

An amplifier system in accordance with the invention may comprise two transistor amplifiers, both having emitter input and collector output. In accordance with the present invention a coupling circuit is provided between the two amplifier stages which has a predetermined pass band. The coupling circuit includes a capacitive and an inductive reactance element connected effectively in series between the emitter and base of the second amplifier stage. An intermediate point of one of the reactance elements, which may be the inductor, is connected to the collector of the first stage. Accordingly, the two reactance elements effectively provide a parallel resonant circuit through the emitter-to-base path of the second amplifier. The width of the pass band is determined by the Q of this parallel resonant circuit. The current gain between the two stages is also determined by the Q of the resonant coupling circuit and by the position of the intermediate point on the inductor connected to the collector of the first stage. Alternatively, the inductor and capacitor of the resonant coupling circuit may be connected individually to the emitter electrodes of two amplifiers from which a push-pull output signal may then be obtained.

Figure 2:
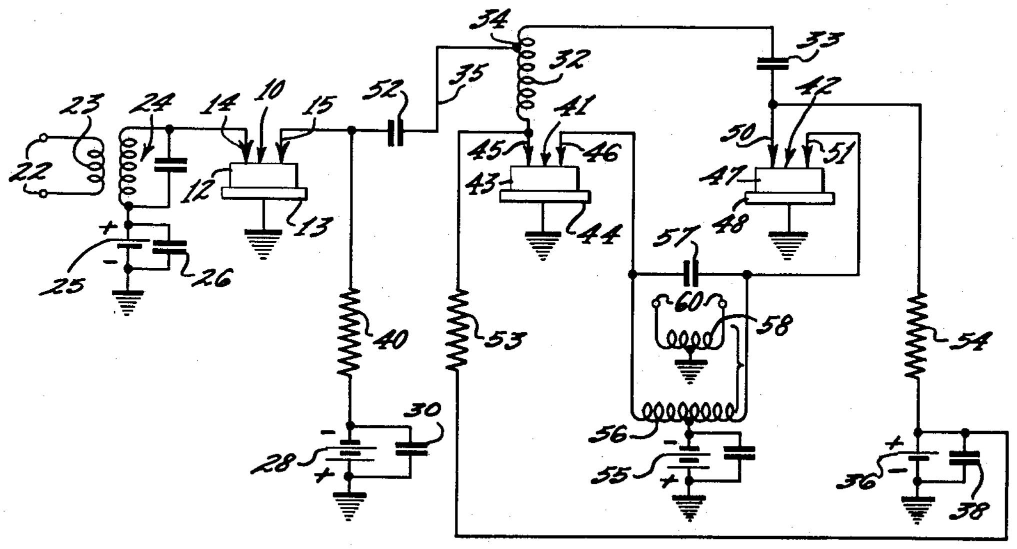

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a circuit diagram of a transistor amplifier system in accordance with the invention having a single-ended output circuit; and Figure 2 is a circuit diagram of modified transistor amplifier system embodying the present invention and having a single-ended input circuit and a push-pull output circuit.

Referring now to the drawing, in which like components have been designated by the same reference numerals, and particularly to Figure 1, there is illustrated an amplifier system including two amplifier stages 10 and 11. Amplifier stage 10 includes a semi-conductor device such as a transistor having a semi-conducting body 12 which may, for example, consist of a germanium or silicon crystal. A base electrode 13 is in low-resistance contact with body 12 and may be a large-area electrode or even a small-area electrode. Emitter electrode 14 and collector electrode 15 are in rectifying contact with the body 12. They may consist of point contacts as indicated or of line contacts or even of large-area rectifying contacts. Amplifier 11 also includes a semi-conducting body 16, a base electrode 17, an emitter electrode 18 and a collector electrode 20 which may be identical with similar elements of amplifier 10.

The first amplifier 10 has a conventional input circuit. A signal such as that developed by a carrier wave source 22 is impressed through inductor 23 and parallel resonant circuit 24 on emitter 14. Base electrode 13 may be grounded as shown. A suitable source of voltage such as battery 25 may have its negative terminal grounded and its positive terminal connected through resonant circuit 24 to emitter 14 to apply a voltage in the forward direction between emitter 14 and base 13. The polarities of the applied operating potentials depend on the conduction type of bodies 12 or 16. The polarities of the operating potentials shown in the drawing are for a body 12 of the N type. However, if body 12 should be of the P type, the applied direct current potentials should be reversed. Battery 25 may be bypassed for signal frequency currents by capacitor 26 connected thereacross.

The output circuit of the second amplifier stage 11 is also conventional and includes a parallel resonant output circuit 27 connected effectively between collector 20 and grounded base 17. A bias potential in the reverse direction is applied between collector 20 and base 17 by a suitable source of voltage such as battery 28 which has its positive terminal grounded, that is, connected to the grounded base 17. The negative terminal of battery 28 is connected to collector 20 through resonant circuit 27. Battery 28 may also be bypassed for signal frequency currents by capacitor 30.

In accordance with the present invention a coupling circuit is provided between amplifier stages 10 and 11.

This coupling circuit includes an inductor 32 and a capacitor 33 which are effectively connected between emitter 18 and base 17. Thus the capacitor 33 may be connected to emitter 18 and the inductor 32 may be connected through battery 28 to the grounded base electrode 17. Intermediate point 34 of inductor 32 is connected to collector 15 through lead 35. Accordingly, an operating voltage is applied to collector 15 through battery 28, the portion of inductor 32 between its lower terminal and its tap 34 and lead 35.

Emitter electrode 18 may be supplied with an operating potential through battery 36 having its negative terminal grounded while its positive terminal is connected to emitter 18 through resistor 37. Battery 36 may also be bypassed for signal frequency currents by capacitor 38.

It is to be understood that the operating voltages may be applied to the amplifier stages 10 and 11 in any other suitable manner. Thus, it is conventional practice to provide an RC network between the emitter and base of a transistor to bias the emitter in the forward direction.

The amplifier system of Figure 1 operates as follows: The carrier wave developed by source 22 is amplified by stage 10 in a conventional manner. Inductor 32 and capacitor 33 form a parallel resonant circuit which is completed through the path between emitter 18 and base 17, which represents a small resistance. The tap 34 is provided in such a position as to match the impedance of collector 15 to that of the parallel resonant ciruit 32, 33. The resistance of resistor 37 should be large compared to the resistance existing between emitter 18 and base 17. Accordingly, battery 36 and resistor 37 provide a shunt feed for the direct current voltage.

The width of the pass band of the coupling circuit is determined by the Q of the parallel resonant circuit 32, 33. The Q of the resonant circuit equals the capacitive or inductive reactance of the circuit divided by the resistance which is essentially represented by the resistance of inductor 32 and by the resistance of the emitter 18, base 17 path. The loss of the inductor 32 should be small so that preferably a high-Q coil is chosen.

The increase of the signal current of the first amplifier stage 10 is essentially given by multiplying the collector current of stage 10 with the Q of the parallel resonant circuit 32, 33. This current gain, however, is reduced because collector 15 is not connected to the junction point between inductor 32 and capacitor 33 but to tap 34. Thus, the relatively high signal current flowing through capacitor 33 also flows through the emitter circuit of amplifier stage 11. By properly selecting the position of tap 34 any desired impedance matching and any desired degree of circuit loading may be achieved. Furthermore, the current gain between stages 10 and 11 may also be determined in this manner.

It is, of course, to be understood that a carrier wave source such, for example, as a vacuum tube amplifier may be coupled across inductor 32 or a portion thereof to impress the carrier wave on amplifier stage 11. If the carrier wave source has a high output impedance such as the anode circuit of a vacuum tube, it may be connected across the entire inductor 32 rather than across a portion thereof.

The amplifier system of Figure 2 has a single-ended or unbalanced input circuit and a push-pull or balanced output circuit. The amplifier system again comprises a first amplifier stage 10, which may have the same input circuit as that of Figure 1. Battery 28 is now connected to collector 15 through a dropping resistor 40.

A pair of amplifier stages 41 and 42 is connected to the first amplifier 10. Amplifier stage 41 includes semi-conducting body 43, base 44, emitter 45 and collector 46. The other amplifier stage 42 also includes a semi-conducting body 47, base electrode 48, emitter 50 and collector 51. Inductor 32 has its free terminal connected to emitter 45 while the free terminal of capacitor 33 is connected to emitter 50. Collector 15 of the first stage 10 is connected to tap 34 through a direct current blocking capacitor 52 and lead 35. The two base electrodes 44, 48 are grounded.

Battery 36 has its positive terminal connected through resistors 53 and 54 to emitters 45 and 50 respectively. The resistance of resistors 53 and 54 should be large compared to the resistance between either emitter 45 and base 44 or emitter 50 and base 48. Battery 55 has its positive terminal grounded while its negative terminal is connected to the midpoint of an inductor 56. Capacitor 57 is connected across inductor 56 to provide a parallel resonant output circuit, and the two terminals of the output circuit are connected to collectors 46 and 51 respectively. A push-pull output signal may be obtained from inductor 58 having its midpoint grounded and inductively coupled to inductor 56. The push-pull output signal may be obtained from output terminals 60.

The amplifier system of Figure 2 operates in a manner similar to that of Figure 1. The parallel resonant coupling circuit including inductor 32 and capacitor 33 is completed through a path between emitter 45, base 44 and base 48, emitter 50. The same current step-up is obtained by connecting collector 15 to tap 34 on inductor 32. Due to the fact that the signal currents developed at emitters 45 and 50 are out of phase the output signal developed across output circuit 56, 57 is in push-pull with respect to the midpoint of inductor 56. The circuit of Figure 2 accordingly permits to obtain a push-pull output signal from a single-ended input circuit.

It will be understood that in both Figures 1 and 2 inductor 32 and capacitor 33 may be exchanged. In that case, a pair of capacitors, preferably of different capacitance, should be provided so that their junction point may be connected to collector 15.

There has thus been disclosed a band pass amplifier system having a coupling circuit between successive transistor amplifier stages which does not require a transformer. The coupling circuit has a predetermined pass band and also provides a current gain between successive stages. It is also feasible to obtain a push-pull output signal by connecting a pair of transistor amplifiers to a first amplifier stage.

What is claimed is:

1. An amplifier system comprising a first amplifier and a second amplifier, said first amplifier including a first semi-conducting body, a first base electrode, a first emitter electrode and a first collector electrode in contact with said first body; said second amplifier including a second semi-conducting body, a second base electrode, a second emitter electrode and a second collector electrode in contact with said second body; means for applying operating potentials to said electrodes, a carrier wave source coupled between said first emitter and said first base electrodes for impressing said carrier wave thereon, an output circuit coupled between said second collector and said second base electrodes; and a coupling circuit having a predetermined pass band for coupling said amplifiers, and including a capacitive reactance element and an inductive reactance element connected in series effectively between said second emitter and said second base electrodes, and a connection between said first collector electrode and an intermediate point of one of said reactance elements, whereby said reactance elements effectively provide a parallel resonant circuit and whereby the width of said pass band is determined by the Q of said resonant circuit.

2. An amplifier system comprising a first amplifier and a second amplifier, said first amplifier including a first semi-conducting body, a first base electrode, a first emitter electrode and a first collector electrode in contact with said first body; said second amplifier including a second semi-conducting body, a second base electrode, a second emitter electrode and a second collector electrode in contact with said second body; means for applying operating potentials to said electrodes, a carrier wave source coupled between said first emitter and said first base electrodes for impressing said carrier wave thereon, an output circuit coupled between said second collector and said second base electrodes; and a coupling circuit having a predetermined pass band for coupling said amplifiers and including a capacitor and an inductor connected in series effectively between said second emitter and said second base electrodes, and a connection between said first collector electrode and an intermediate point of said inductor whereby the width of said pass band is determined by the effective Q of the parallel resonant circuit provided by said capacitor and inductor.

3. An amplifier system comprising a first amplifier and a second amplifier, said first amplifier including a first semi-conducting body, a first base electrode, a first emitter electrode and a first collector electrode in contact with said first body; said second amplifier including a second semi-conducting body, a second base electrode, a second emitter electrode and a second collector electrode in contact with said second body; means for applying operating potentials to said electrodes including a source of voltage and a resistor connected between said second emitter and said second base electrodes, said resistor having a resistance that is large compared to that between said second emitter and said second base electrode, a carrier wave source coupled between said first emitter and said first base electrodes for impressing said carrier wave thereon, an output circuit coupled between said second collector and said second base electrodes; and a coupling circuit having a predetermined pass band for coupling said amplifiers, and including a capacitor and an inductor connected in series effectively between said second emitter and said second base electrode to provide a parallel resonant circuit, and a circuit connection between said first collector electrode and an intermediate point of said inductor, whereby the position of said intermediate point determines the impedance match between said coupling circuit and said first amplifier.

References Cited in the file of this patent

UNITED STATES PATENTS

| | | |
|---|---|---|
| 2,486,776 | Barney | Nov. 1, 1949 |
| 2,517,960 | Barney et al. | Aug. 8, 1950 |
| 2,524,035 | Bardeen et al. | Oct. 3, 1950 |
| 2,556,286 | Meacham | June 12, 1951 |
| 2,570,939 | Goodrich | Oct. 9, 1951 |